United States Patent
Cho et al.

(10) Patent No.: US 10,074,620 B2
(45) Date of Patent: Sep. 11, 2018

(54) SEMICONDUCTOR PACKAGE WITH INTEGRATED OUTPUT INDUCTOR USING CONDUCTIVE CLIPS

(71) Applicant: Infineon Technologies Americas Corp., El Segundo, CA (US)

(72) Inventors: Eung San Cho, Torrance, CA (US); Darryl Galipeau, Warwick, RI (US); Dan Clavette, Greene, RI (US)

(73) Assignee: Infineon Technologies Americas Corp., El Segundo, CA (US)

( * ) Notice: Subject to any disclaimer, the term of this patent is extended or adjusted under 35 U.S.C. 154(b) by 314 days.

(21) Appl. No.: 15/013,858

(22) Filed: Feb. 2, 2016

(65) Prior Publication Data
US 2016/0286656 A1  Sep. 29, 2016

Related U.S. Application Data

(60) Provisional application No. 62/137,967, filed on Mar. 25, 2015.

(51) Int. Cl.
*H01L 23/64* (2006.01)
*H01L 23/49* (2006.01)
(Continued)

(52) U.S. Cl.
CPC ....... *H01L 23/645* (2013.01); *H01F 17/0033* (2013.01); *H01L 23/495* (2013.01);
(Continued)

(58) Field of Classification Search
CPC .............. H01L 23/645; H01L 23/495; H01L 23/49537; H01L 23/49562; H01L 24/49;
(Continued)

(56) References Cited

U.S. PATENT DOCUMENTS 7,268,659 B2   9/2007 Nishio et al.
8,148,815 B2   4/2012 Girdhar et al.
(Continued)

FOREIGN PATENT DOCUMENTS

CN  1531093 A   9/2004
CN  1841901 A   10/2006
(Continued)

OTHER PUBLICATIONS

Office Action, in Chinese language, from counterpart Chinese Patent Application No. 201610146762.1, dated Mar. 1, 2018, 8 pp.

*Primary Examiner* — Michael P McFadden
(74) *Attorney, Agent, or Firm* — Shumaker & Sieffert, P.A.

(57) ABSTRACT

A semiconductor package includes a semiconductor die having a control transistor and a sync transistor, an integrated output inductor having a winding around a core, and coupled to the semiconductor die, where the winding includes a plurality of top conductive clips connected to a plurality of bottom conductive clips. The control transistor and the sync transistor are configured as a half-bridge. The integrated output inductor is coupled to a switched node of the half-bridge. At least one of the plurality of top conductive clips and the plurality of bottom conductive clips includes a partially etched portion and a non-etched portion. The semiconductor die is attached to the integrated output inductor by a die attach material. The semiconductor die and the integrated output inductor are encapsulated in a molding compound.

20 Claims, 5 Drawing Sheets

(51) Int. Cl.
*H01L 23/31* (2006.01)
*H01L 23/495* (2006.01)
*H01F 17/00* (2006.01)
*H02M 3/158* (2006.01)
*H01L 23/00* (2006.01)

(52) U.S. Cl.
CPC .. *H01L 23/49537* (2013.01); *H01L 23/49562* (2013.01); *H01L 24/49* (2013.01); *H01L 23/3121* (2013.01); *H01L 24/32* (2013.01); *H01L 24/45* (2013.01); *H01L 24/48* (2013.01); *H01L 24/73* (2013.01); *H01L 2224/32245* (2013.01); *H01L 2224/45014* (2013.01); *H01L 2224/45124* (2013.01); *H01L 2224/45144* (2013.01); *H01L 2224/45147* (2013.01); *H01L 2224/48091* (2013.01); *H01L 2224/48247* (2013.01); *H01L 2224/48257* (2013.01); *H01L 2224/49171* (2013.01); *H01L 2224/73265* (2013.01); *H01L 2924/00011* (2013.01); *H01L 2924/1032* (2013.01); *H01L 2924/1033* (2013.01); *H01L 2924/10253* (2013.01); *H01L 2924/13055* (2013.01); *H01L 2924/13064* (2013.01); *H01L 2924/13091* (2013.01); *H01L 2924/14* (2013.01); *H01L 2924/181* (2013.01); *H01L 2924/19042* (2013.01); *H02M 3/158* (2013.01)

(58) Field of Classification Search
CPC ..... H01L 23/3121; H01L 24/32; H01L 24/45; H01L 24/48; H01L 24/73; H01L 2224/32245; H01L 2224/45014; H01L 2224/45124; H01L 2224/45144; H01L 2224/45147; H01L 2224/48091; H01L 2224/48247; H01L 2224/48257; H01L 2224/49171; H01L 2224/73265; H01L 2924/00011; H01F 17/0033
USPC .......................................................... 257/678
See application file for complete search history.

(56) References Cited

U.S. PATENT DOCUMENTS

| 8,803,486 | B2 | 8/2014 | Norimatsu et al. |
| 9,640,604 | B2 | 5/2017 | Chen |
| 2004/0179383 | A1* | 9/2004 | Edo ............... H01F 27/24 363/111 |
| 2005/0052268 | A1 | 3/2005 | Pleskach et al. |
| 2008/0122418 | A1 | 5/2008 | Briere et al. |

FOREIGN PATENT DOCUMENTS

| CN | 1925720 A | 3/2007 |
| CN | 102318176 A | 1/2012 |
| CN | 104160513 A | 11/2014 |

* cited by examiner

US 10,074,620 B2

SEMICONDUCTOR PACKAGE WITH INTEGRATED OUTPUT INDUCTOR USING CONDUCTIVE CLIPS

BACKGROUND

The present application claims the benefit of and priority to a provisional patent application entitled "Dual Gauge Leadframe with Embedded Inductor," Ser. No. 62/137,967 filed on Mar. 25, 2015. The disclosure in this provisional application is hereby incorporated fully by reference into the present application.

Power converters, such as voltage regulators, are used in a variety of electronic circuits and systems. For instance, integrated circuit (IC) applications may require conversion of a direct current (DC) input to a lower, or higher, DC output. As an example, a buck converter may be implemented as a voltage regulator to convert a higher voltage DC input to a lower voltage DC output for use in low voltage applications. Semiconductor packaging solutions for power converters may be configured to accommodate power transistors and an output inductor.

In conventional semiconductor packages, the output inductor utilized in the power converter is placed side by side with other components in the power converter, such as the power transistors. The lateral placement of the output inductor with the other components increases the overall size of the semiconductor package. Also, in the conventional semiconductor packages, the output inductor is a pre-formed inductor with a relatively large form factor and poor thermal performance. Integrating the pre-formed inductor with the power transistors can further increase the overall form factor of the semiconductor package and degrade the thermal performance.

Accordingly, there is a need to overcome the drawbacks and deficiencies in the art by providing a semiconductor package having an integrated output inductor with reduced form factor and enhanced thermal dissipation.

SUMMARY

The present disclosure is directed to a semiconductor device with an integrated output inductor using conductive clips, substantially as shown in and/or described in connection with at least one of the figures, and as set forth in the claims.

DETAILED DESCRIPTION

Figure 1:
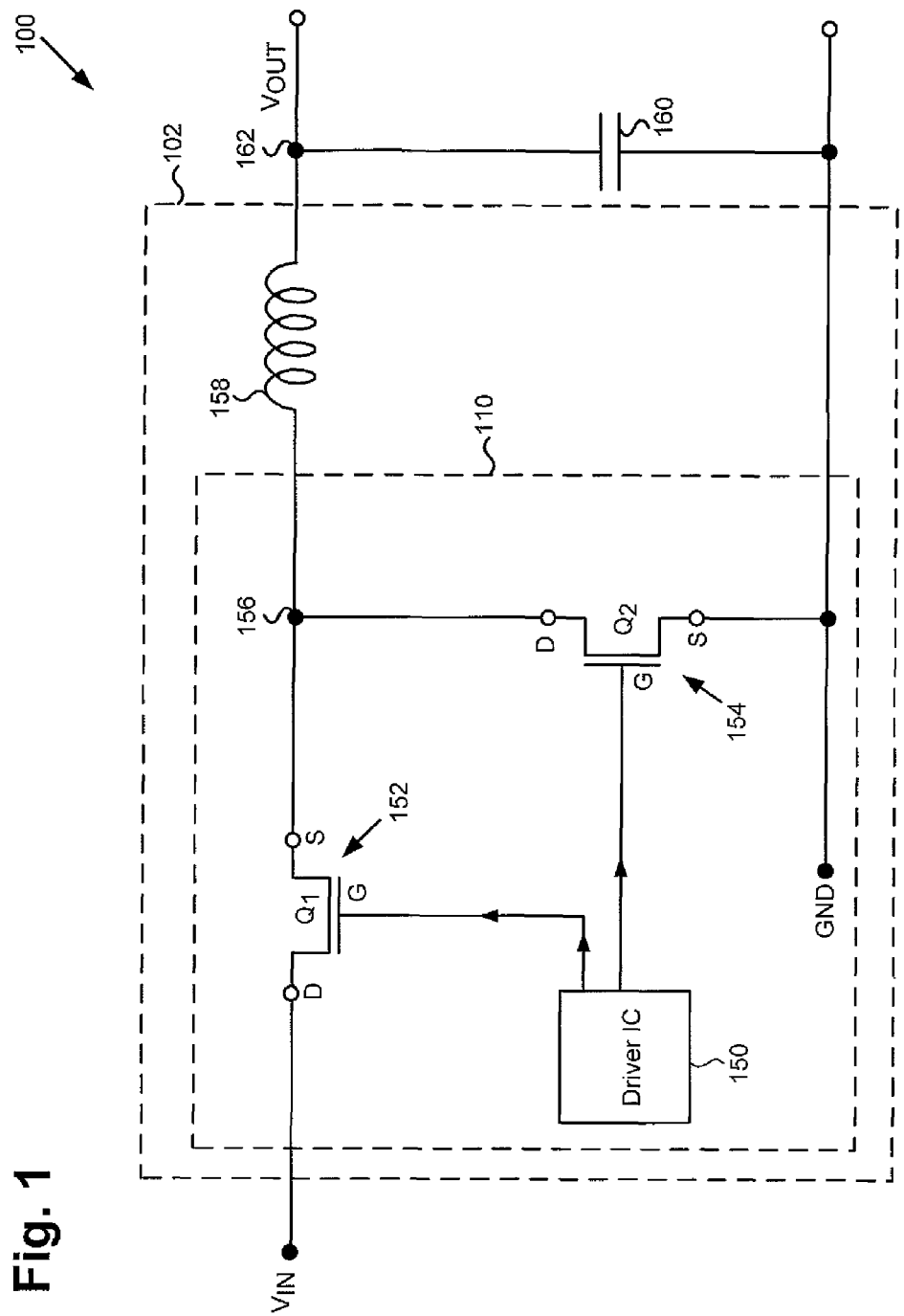
FIG. 1 illustrates a diagram of an exemplary circuit suitable for use as a power converter, according to one implementation of the present disclosure.

The following description contains specific information pertaining to implementations in the present disclosure. The drawings in the present application and their accompanying detailed description are directed to merely exemplary implementations. Unless noted otherwise, like or corresponding elements among the figures may be indicated by like or corresponding reference numerals. Moreover, the drawings and illustrations in the present application are generally not to scale, and are not intended to correspond to actual relative dimensions.

Referring to FIG. 1, FIG. 1 illustrates a diagram of an exemplary circuit suitable for use as a power converter, according to one implementation of the present disclosure. Power converter circuit 100 includes power converter package 102 and output capacitor 160. Power converter package 102 includes power stage 110 and output inductor 158. As shown in FIG. 1, power stage 110 includes high side or control transistor 152 ($Q_1$) coupled to low side or sync transistor 154 ($Q_2$) at switched node 156, as well as pulse-width modulation (PWM) control and driver 150 coupled to control transistor 152 and sync transistor 154. It is noted that PWM control and driver 150 may be implemented as a PWM and control driver IC, and is configured to provide drive signals to the respective gates of control transistor 152 and sync transistor 154. As further shown in FIG. 1, power converter circuit 100 is configured to receive an input voltage $V_{IN}$, and to provide a converted voltage, e.g., a rectified and/or stepped down voltage, as $V_{OUT}$ at output node 162.

In the present implementation, control transistor 152 and sync transistor 154 of power stage 110 may take the form of metal-oxide-semiconductor field-effect transistors (MOSFETs) configured as a half-bridge, for example. That is to say, control transistor 152 may be coupled to sync transistor 154 at switched node 156, which, in turn, may be coupled to output node 162 through output inductor 158. In some implementations, control transistor 152 and sync transistor 154 may be implemented as group IV based power transistors, such as silicon power MOSFETs having a vertical or lateral design, for example. In other implementations, control transistor 152 and sync transistor 154 may be implemented as field-effect transistors (FETs), insulated gate bipolar transistors (IGBTs), or high electron mobility transistors (HEMTs), for example. In general, control transistor 152 and sync transistor 154 may be implemented as group IV power transistors, such as silicon power transistors, or as group III-V power transistors, such as gallium nitride (GaN) power transistors. In some implementations, it may be advantageous or desirable for at least one of control transistor 152 and sync transistor 154 to be implemented as a group III-V power transistor, such as a GaN power transistor, for example. Power converter circuit 100 may be advantageously utilized, for example as a buck converter, in a variety of automotive, industrial, appliance, and lighting applications.

It is noted that in the interests of ease and conciseness of description, the present inventive principles will in some instances be described by reference to specific implementations of a buck converter including one or more silicon based power FETs. However, it is emphasized that such implementations are merely exemplary, and the inventive principles disclosed herein are broadly applicable to a wide range of applications, including buck and boost converters, implemented using other group IV material based, or group III-V semiconductor based, power transistors.

It is further noted that as used herein, the phrase "group III-V" refers to a compound semiconductor including at least one group III element and at least one group V element. By way of example, a group III-V semiconductor may take the form of a III-Nitride semiconductor that includes nitrogen and at least one group III element. For instance, a III-Nitride power transistor may be fabricated using gallium nitride (GaN), in which the group III element or elements include some or a substantial amount of gallium, but may also include other group III elements in addition to gallium.

Figure 3A:
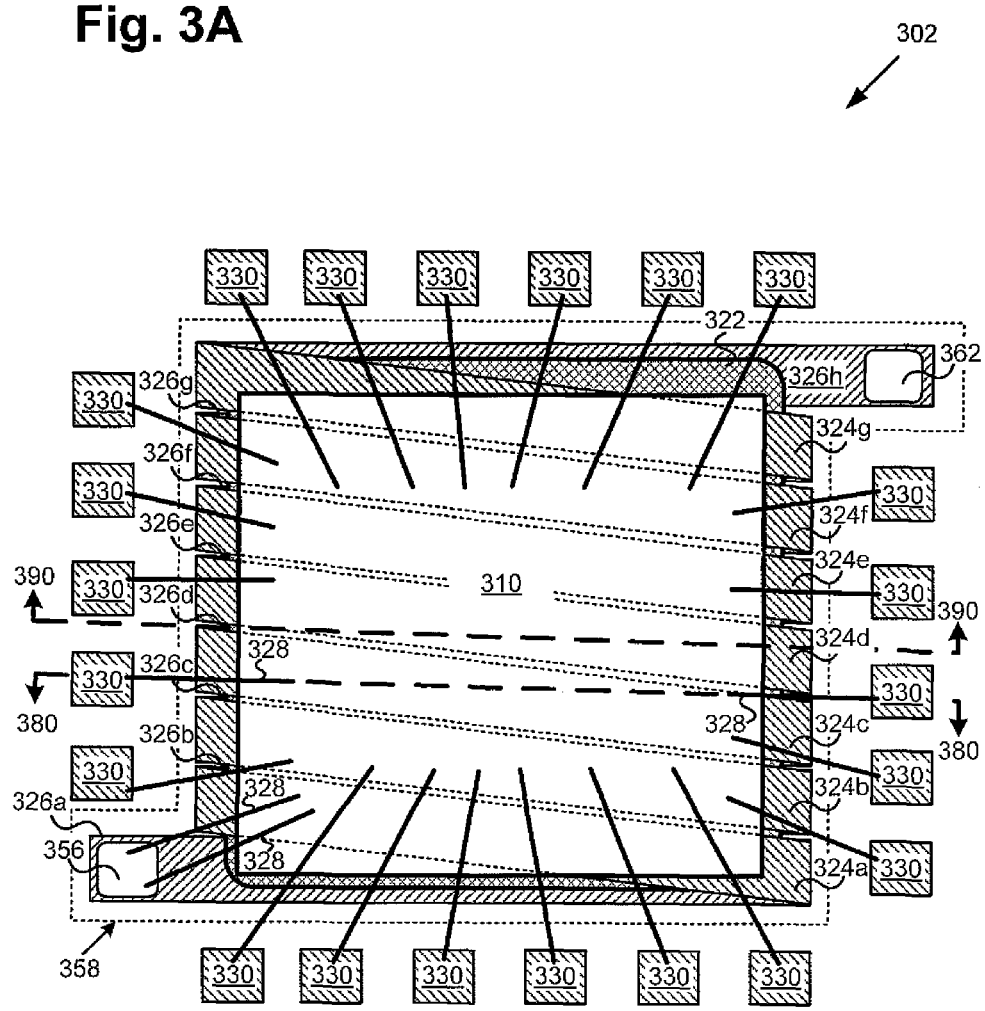
FIG. 3A illustrates a top plan view of a semiconductor package having an integrated output inductor, according to one implementation of the present disclosure.
Figure 3B:
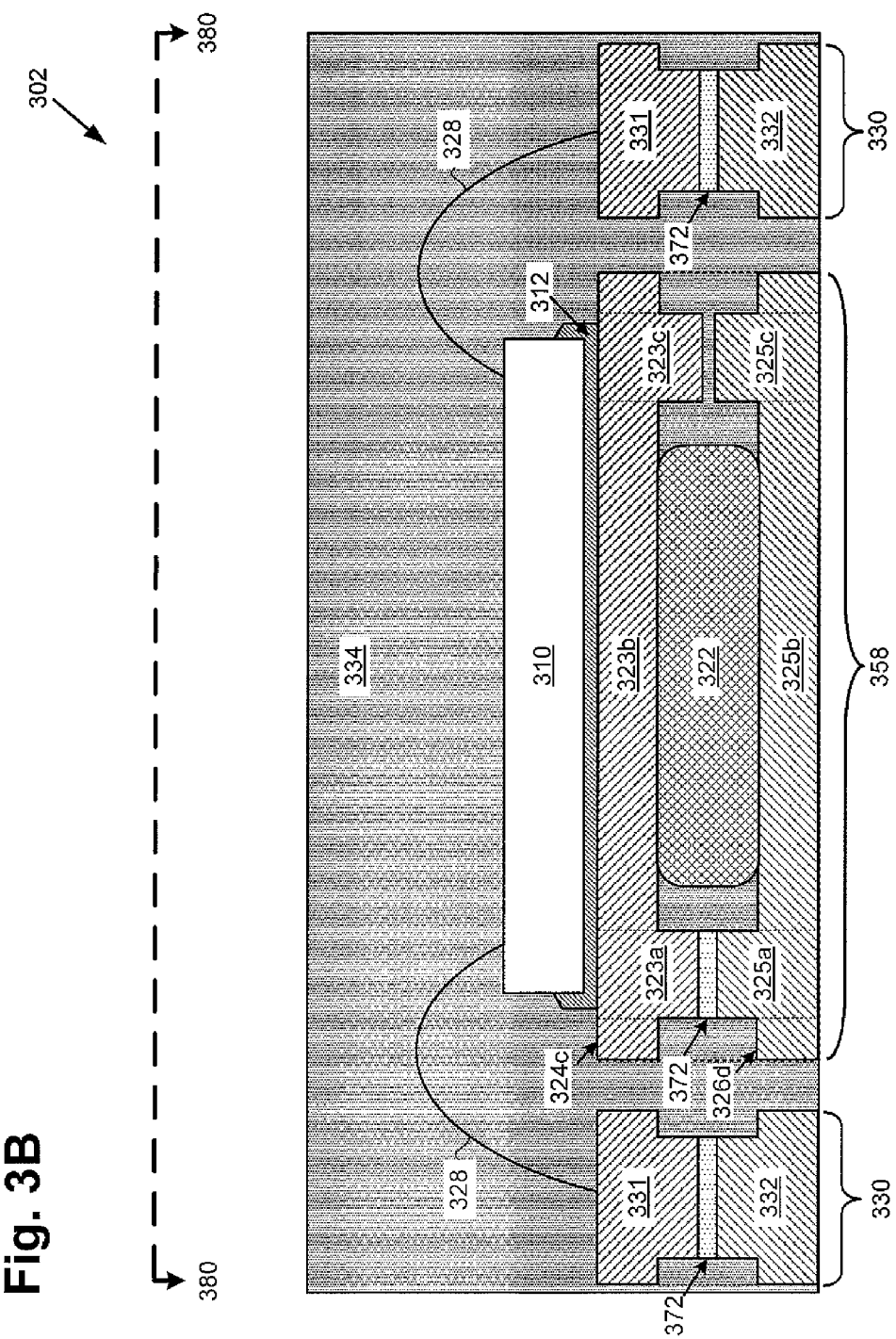
FIG. 3B illustrates a cross-sectional view of a semiconductor package having an integrated output inductor, according to one implementation of the present disclosure.
Figure 3C:
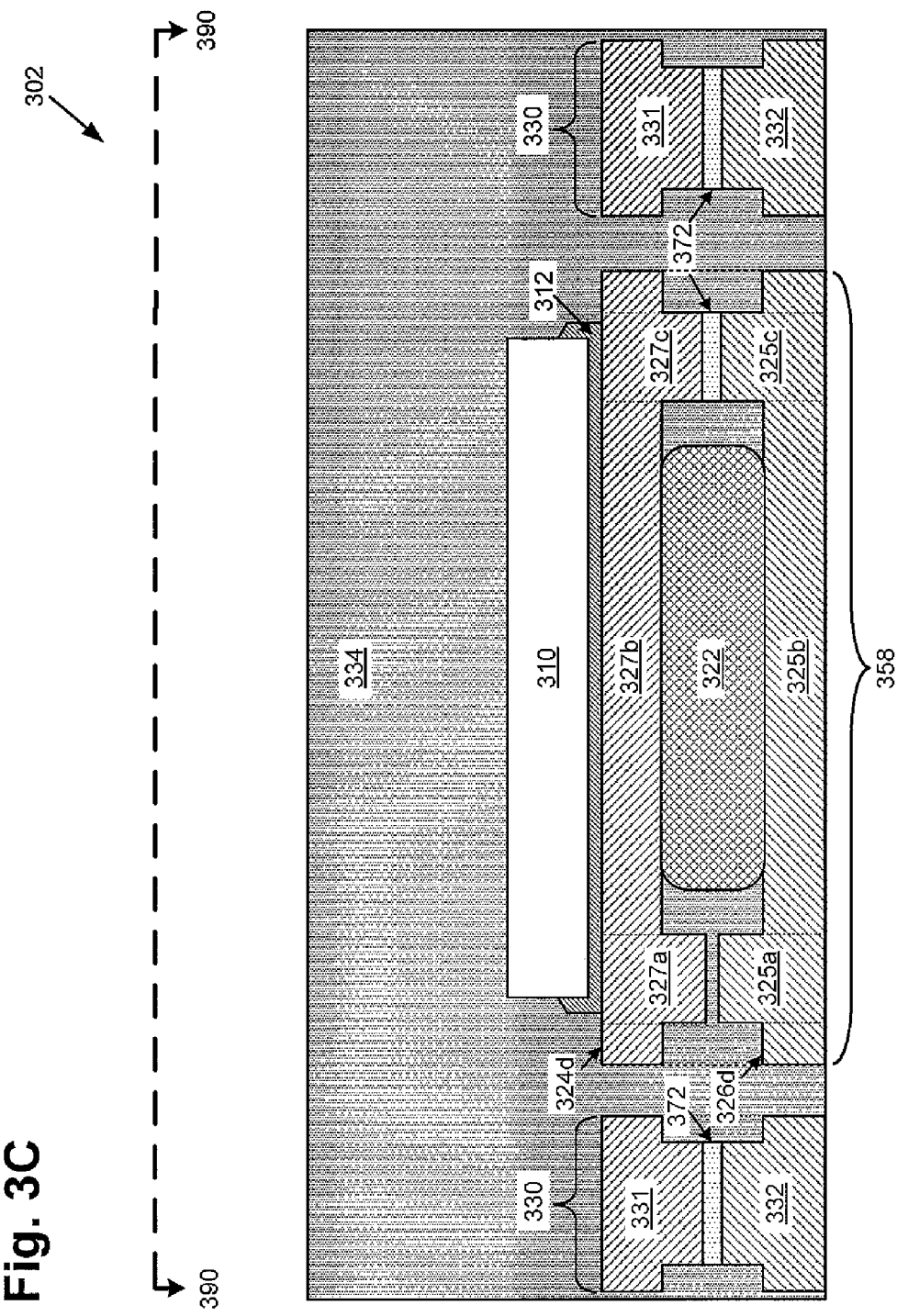
FIG. 3C illustrates a cross-sectional view of a semiconductor package having an integrated output inductor, according to one implementation of the present disclosure.

It should be noted with reference to the drawings of the present application that implementations of the present disclosure are described with respect to a power stage and an output inductor within a power semiconductor package, such as semiconductor die 310 and integrated output inductor 358 within power semiconductor package 302 of FIGS. 3A, 3B and 3C. Each semiconductor die 310 in FIGS. 3A, 3B and 3C may correspond to power stage 110 of FIG. 1 and each integrated output inductor 358 may correspond to output inductor 158 of FIG. 1. In some implementations, semiconductor die 310 corresponding to power stage 110, and integrated output inductor 358 corresponding to output inductor 158 may be electrically coupled to each other in a manner shown in power converter circuit 100 of FIG. 1.

As electronic devices and systems move toward ever smaller form factors, the large circuit board area still required to accommodate an output inductor, such as output inductor 158 in FIG. 1, becomes increasingly costly. As such, the present application discloses a packaging solution utilizing a stacked architecture enabling fabrication of a power semiconductor package including an integrated output inductor but requiring substantially no greater area than a package enclosing the power transistors and driver circuitry alone. Moreover, according implementations of the present disclsoure, conductive clips having non-etched portions and partially etched portions are utilized to form a continuous wire winding and embed a core within an interiror space formed by the the partially etched portions of the conductive clips, thereby further reducing the package height or thickness.

Figure 2:
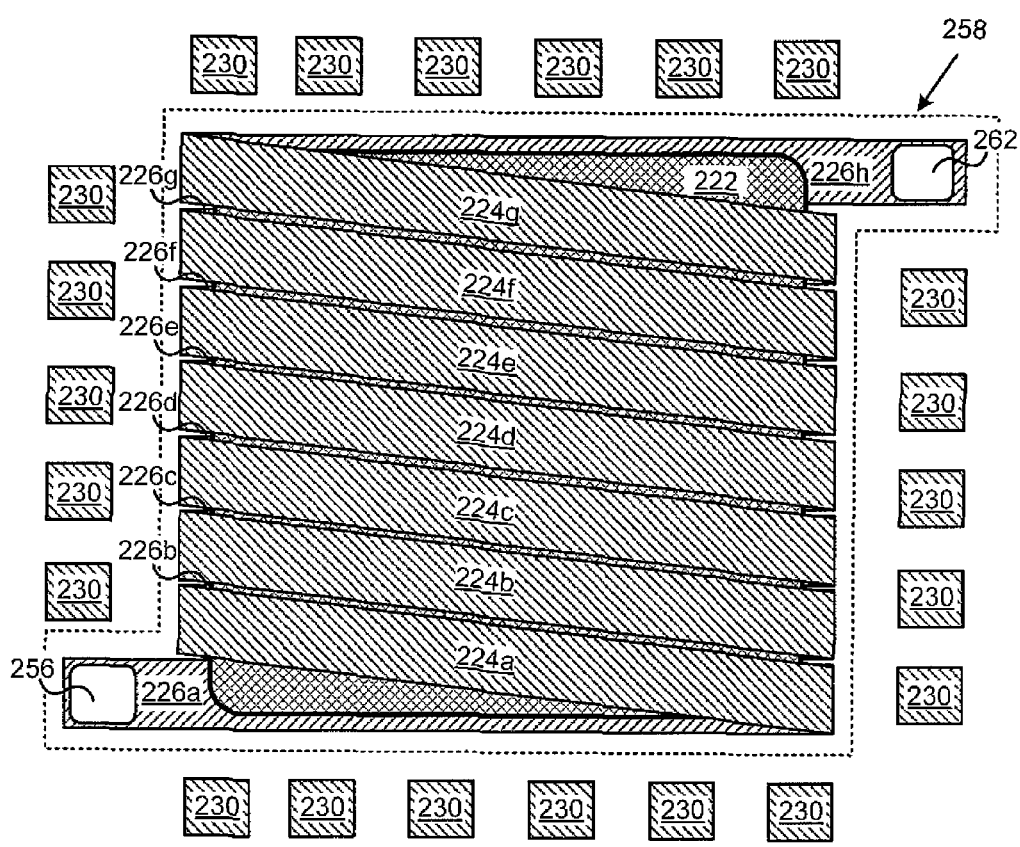
FIG. 2 illustrates a top plan view of an integrated output inductor, according to one implementation of the present disclosure.

Referring now to FIG. 2, FIG. 2 illustrates a top plan, view of an integrated output inductor, according to one implementation of the present disclosure. As illustrated in FIG. 2, integrated output inductor 258 includes core 222, top conductive clips 224a, 224b, 224c, 224d, 224e, 224f and 224g (collectively referred to as "top conductive clips 224"), and bottom conductive clips 226a, 226b, 226c, 226d, 226e, 226f, 226g and 226h (collectively referred to as "bottom conductive clips 226"). As illustrated in FIG. 2, top conductive clips 224 are situated above core 222, while bottom conductive clips 226 are situated below core 222, where top conductive clips 224 are connected to bottom conductive clips 226 to form a continuous wire winding wrapped around and substantially embedding core 222.

In the present implementation, integrated output inductor 258 may correspond to output inductor 158 in FIG. 1. As illustrated in FIG. 2, one end of integrated output inductor 258 is coupled to switched node pad 256 corresponding to switched node 156 in FIG. 1, while the other end of integrated output inductor 258 is coupled to output node pad 262 corresponding to output node 162 in FIG. 1.

As illustrated in FIG. 2, top conductive clips 224a, 224b, 224c, 224d, 224e, 224f and 224g are substantially parallel to and spaced from one another over core 222, while bottom conductive clips 226a, 226b, 226c, 226d, 226e, 226f, 226g and 226h are substantially parallel to and spaced from one another below core 222. As further illustrated in FIG. 2, top conductive clips 224a, 224b, 224c, 224d, 224e, 224f and 224g are arranged at a slightly slanted angle from bottom conductive clips 226a, 226b, 226c, 226d, 226e, 226f, 226g and 226h. As a result of this arrangement, top conductive clip 224a connects bottom conductive clip 226a to bottom conductive clip 226b. Top conductive clip 224b connects bottom conductive clip 226b to bottom conductive clip 226c. Top conductive clip 224c connects bottom conductive clip 226c to bottom conductive clip 226d. Top conductive clip 224d connects bottom conductive clip 226d to bottom conductive clip 226e. Top conductive clip 224e connects bottom conductive clip 226e to bottom conductive clip 226f. Top conductive clip 224f connects bottom conductive clip 226f to bottom conductive clip 226g. Top conductive clip 224g connects bottom conductive clip 226g to bottom conductive clip 226h.

In the present implementation, core 222 includes a ferrite core. In other implementations, core 222 may include other suitable material, such as plastic, ferromagnetic or ceramic material. In the present implementation, top conductive clips 224a, 224b, 224c, 224d, 224e, 224f and 224g may each include a conductive clip having a partially partially etched portion and at least one non-etched portion, which are not explicitly shown in FIG. 2. Similarly, bottom conductive clips 226a, 226b, 226c, 226d, 226e, 226f, 226g and 226h may each also include a conductive clip having a partially etched portion and at least one non-etched portion, which are not explicitly shown in FIG. 2.

As illustrated in FIG. 2, I/O pads 230 are formed around the perimeters of integrated output inductor 258 for electrical connections for a power converter package as described in detail with reference to FIGS. 3A, 3B and 3C below. In some implementations, top conductive clips 224a, 224b, 224c, 224d, 224e, 224f and 224g, bottom conductive clips 226a, 226b, 226c, 226d, 226e, 226f, 226g and 226h and I/O pads 230 may each include any conductive material having high current carrying capability and a suitably low electrical resistance. For example, top conductive clips 224, bottom conductive clips 226 and I/O pads 230 may each include copper, aluminum, or a metallic alloy. The thickness, length and depth of integrated output inductor 258 may vary to suit the needs of a particular application.

Referring now to FIG. 3A, FIG. 3A illustrates a top plan view of a semiconductor package having an integrated output inductor, according to one implementation of the present disclosure. As illustrated in FIG. 3A, semiconductor package 302 includes semiconductor die 310 stacked over integrated output inductor 358, where integrated output inductor 358 includes core 322, top conductive clips 324a, 324b, 324c, 324d, 324e, 324f and 324g (collectively referred to as "top conductive clips 324"), and bottom conductive clips 326a, 326b, 326c, 326d, 326e, 326f, 326g and 326h (collectively referred to as "bottom conductive clips 326"). Semiconductor die 310 is stacked over and coupled to integrated output inductor 358 by a die attach material (not explicitly shown in FIG. 3A).

In the present implementation, semiconductor die 310 may include a power stage (not explicitly shown in FIG. 3A), which may correspond to power stage 110 in FIG. 1. Semiconductor die 310 may include a high side or control transistor (e.g., control transistor 152 in FIG. 1) coupled to a low side or sync transistor (e.g., sync transistor 154 in FIG. 1) at a switched node (e.g., switched node 156 in FIG. 1). Semiconductor die 310 may also include a PWM control and driver (e.g., PWM control and driver 150 in FIG. 1) coupled to the control transistor and the sync transistor. In an implementation, the PWM control and driver may be implemented as a PWM and control driver IC, and is configured to provide drive signals to the respective gates of the control transistor and the sync transistor. In an implementation, the power stage, having the control transistor and the sync transistor, is monolithically integrated on semiconductor die 310. It is noted that the PWM control and driver, the control transistor and the sync transistor are not explicitly shown in FIG. 3A, but may be monolithically integrated on semiconductor die 310 in any suitable method and/or manner known in the art.

In the present implementation, semiconductor die 310 may include group IV material, such as silicon. In another implementation, semiconductor die 310 may include group III-V material, such as gallium nitride (GaN). In some implementations, it may be advantageous or desirable for at least one of the control transistor and the sync transistor to be implemented as a group III-V power transistor, such as a GaN power transistor, for example.

In the present implementation, integrated output inductor 358 may correspond to integrated output inductor 258 in FIG. 2, which may correspond to output inductor 158 in FIG. 1. Integrated output inductor 358 includes switched node pad 356 and output node pad 362, which may correspond to respective switched node 156 and output node 162 in FIG. 1. As illustrated in. FIG. 3A, switched node pad 356 is coupled to bottom conductive clip 326a at one end of integrated output inductor 358, and output node pad 362 is coupled bottom conductive clip 326h at the other end of integrated output inductor 358. In one implementation, top conductive clips 324 and bottom conductive clips 326 may each include any conductive material having high current carrying capability and a suitably low electrical resistance. For example, top conductive clips 324 and bottom conductive clips 326 may each include copper, aluminum, or a metallic alloy. The thickness, length and depth of integrated output inductor 358 may vary to suit the needs of a particular application.

As illustrated in FIG. 3A, top conductive clips 324a, 324b, 324c, 324d, 324e, 324f and 324g are substantially parallel to and spaced from one another over core 322, while bottom conductive clips 326a, 326b, 326c, 326d, 326e, 326f, 326g and 326h are substantially parallel to and spaced from one another below core 322. As further illustrated in FIG. 3A, top conductive clips 324a, 324b, 324c, 324d, 324e, 324f and 324g are arranged at a slightly slanted angle from bottom conductive clips 326a, 326b, 326c, 326d, 326e, 326f, 326g and 326h. As a result of this arrangement, top conductive clip 324a connects bottom conductive clip 326a to bottom conductive clip 326b. Top conductive clip 324b connects bottom conductive clip 326b to bottom conductive clip 326c. Top conductive clip 324c connects bottom conductive clip 326c to bottom conductive clip 326d. Top conductive clip 324d connects bottom conductive clip 326d to bottom conductive clip 326e. Top conductive clip 324e connects bottom conductive clip 326e to bottom conductive clip 326f. Top conductive clip 324f connects bottom conductive clip 326f to bottom conductive clip 326g. Top conductive clip 324g connects bottom conductive clip 326g to bottom conductive clip 326h. As a result, top conductive clips 324 and bottom conductive clips 326 are connected to form a continuous wire winding around core 322.

The number of windings of the wire winding formed by top conductive clips 324a, 324b, 324c, 324d, 324e, 324f and 324g, and bottom conductive clips 326a, 326b, 326c, 326d, 326e, 326f, 326g and 326h, may range from a few to several hundred windings. Top conductive clips 324a, 324b, 324c, 324d, 324e, 324f and 324g are connected to bottom conductive clips 326a, 326b, 326c, 326d, 326e, 326f, 326g and 326h by using electrical connectors (not explicitly shown in FIG. 3A). The electrical connectors may include solder bodies, such as solder paste, for example. In other implementations, the electrical connectors may take the form of an electrically conductive die attach material. For example, electrically conductive die attach materials may include conductive epoxies, conductive sintered materials, or diffusion bonded materials. For example, electrically conductive die attach materials may include conductive epoxies, conductive sintered materials, or diffusion bonded materials.

In the present implementation, core 322 includes a ferrite core. In other implementations, core 322 may include other suitable material, such as plastic, ferromagnetic or ceramic material. In the present implementation, top conductive clips 324a, 324b, 324c, 324d, 324e, 324f and 324g may each include a conductive clip having a partially etched portion and at least one non-etched portion, which are not explicitly shown in FIG. 3A. Similarly, bottom conductive clips 326a, 326b, 326c, 326d, 326e, 326f, 326g and 326h may each also include a conductive clip having a partially etched portion and at least one non-etched portion, which are not explicitly shown in FIG. 3A.

Semiconductor package 302 also includes I/O pads 330 around the perimeters of integrated output inductor 358, where I/O pads 330 are electrically coupled to semiconductor die 310 through wire bonds 328, for example. As illustrated in FIG. 3A, wire bonds 328 are configured to electrically couple various terminals (not explicitly shown in FIG. 3A) at a top surface of semiconductor die 310 to respective I/O pads 330. Also, one or more wire bonds 328 are configured to electrically couple a switched node (e.g., switched node 156 in FIG. 1) of semiconductor die 310 to switched node pad 356 on bottom conductive clip 326a. In some implementations, wire bonds 328 may each include copper, gold, or another suitable conductive material, for example. In other implementations, wire bonds 328 may be replaced by conductive ribbons or other connectors including conductive materials such as Al, Au, Cu, and/or other metals or composite materials.

A packaging enclosure (not explicitly shown in FIG. 3A) is configured to encapsulate semiconductor die 310, die attach material 312, integrated output inductor 358, wire bonds 328, and I/O pads 330 to form an enclosed package. Packaging enclosure 334 may include any suitable substance, such as an encapsulant and/or a molding compound for providing mechanical and/or environmental protection for semiconductor package 302. In some implementations, semiconductor package 302 may be a quad-flat no-leads (QFN) package, such as a power QFN (PQFN) package.

Referring now to FIG. 3B, FIG. 3B illustrates a cross-sectional view of a semiconductor package having an integrated output inductor, according to one implementation of the present disclosure. In particular, FIG. 3B illustrates a cross-sectional view of semiconductor package 302 along line 380-380 in FIG. 3A. With similar numerals representing similar features in FIG. 3A, semiconductor package 302 in FIG. 3B includes semiconductor die 310 stacked over and attached to integrated output inductor 358 by die attach material 312. Integrated output inductor 358 includes, in part, core 322 and a winding having top conductive clip 324c connected to bottom conductive clip 326d. As illustrated in FIG. 3B, semiconductor package 302 also includes I/O pads 330 on the perimeters of integrated output inductor 358, and coupled to semiconductor die 310 through wire bonds 328. Packaging enclosure 334 is configured to encapsulate semiconductor die 310, die attach material 312, integrated output inductor 358, wire bonds 328, I/O pads 330, and electrical connectors 372 to form an enclosed package.

As illustrated in FIG. 3B, top conductive clip 324*c* includes non-etched portions 323*a* and 323*c*, and partially etched portion 323*b*. Non-etched portions 323*a* and 323*c* retain a full thickness of top conductive clip 324*c*, while partially etched portion 323*b* has a thickness that is a fraction (e.g., half) of the full thickness of top conductive clip 324*c*. In the present implementation, non-etched portions 323*a* and 323*c* have a substantially uniform thickness that is the full thickness of top conductive clip 324*c*. Partially etched portion 323*b* also has a substantially uniform thickness that is a fraction of the full thickness of top conductive clip 324*c*. Bottom conductive clip 326*d* includes non-etched portions 325*a* and 325*c*, and partially etched portion 325*b*. Non-etched portions 325*a* and 325*c* retain a full thickness of bottom conductive clip 326*d*, while partially etched portion 325*b* has a thickness that is a fraction (e.g., half) of the full thickness of bottom conductive clip 326*d*. In the present implementation, non-etched portions 325*a* and 325*c* have a substantially uniform thickness that is the full thickness of bottom conductive clip 326*d*. Partially etched portion 325*b* also has a substantially uniform thickness that is a fraction of the full thickness of bottom conductive clip 326*d*.

As illustrated in FIG. 3B, top conductive clip 324*c* and bottom conductive clip 326*d* form a winding around core 322, where non-etched portion 323*a* of top conductive clip 324*c* is electrically and mechanically coupled to non-etched portion 325*a* of bottom conductive clip 326*d* at one end of integrated output inductor 358 by using electrical connector 372, such as solder paste. Partially etched portion 323*b* of top conductive clip 324*c* forms a recess in top conductive clip 324*c*. Partially etched portion 325*b* of bottom conductive clip 326*d* forms a recess in bottom conductive clip 326*d* under the recess formed by partially etched portion 323*b* of top conductive clip 324*c*. Thus, the recesses in top conductive clip 324*c* and bottom conductive clip 326*d* together form an interior space for housing or embedding core 322.

It is noted that, in the cross-sectional view shown in FIG. 3B, top conductive clip 324*c* and bottom conductive clip 326*d* are only connected at one end of integrated output inductor 358. This is because top conductive clip 324*c* is situated above and arranged at a slightly slanted angle from bottom conductive clip 326*d* (as shown in FIG. 3A). As a result of this arrangement, non-etched portion 325*c* of bottom conductive clip 326*d* is connected to a non-etched portion (e.g., non-etched portion 327*c* in FIG. 3C) of top conductive clip 324*d* (not explicitly shown in FIG. 3B), while non-etched portion 323*c* of top conductive clip 324*c* is connected to a non-etched portion of bottom conductive clip 326*c* (not explicitly shown in FIG. 3B). Thus, top conductive clips 324 and bottom conductive clips 326 are connected in such a way to form a continuous wire winding around core 322 as shown in FIG. 3A.

As illustrated in FIG. 3B, wire bonds 328 are configured to electrically couple various terminals (not explicitly shown in FIG. 3B) at a top surface of semiconductor die 310 to respective I/O pads 330. In the present implementation, I/O pads 330 each include top pad 331 connected to bottom pad 332 using electrical connector 372, such as solder paste. In the present implementation, top pad 331 and bottom pad 332 may each include a non-etched portion and a partially etched portion, as shown in FIG. 3B. In the present implementation, bottom conductive clip 326*d* and bottom pads 332 of I/O pads 330 may be formed in a single processing action, while top conductive clip 324*c* and top pads 331 of I/O pads 330 may be formed in a single processing action. In the present implementation, top conductive clip 324*c*, bottom conductive clip 326*d* and I/O pads 330 may each include any conductive material having high current carrying capability and a suitably low electrical resistance, such as copper, aluminum, tungsten or a metallic alloy.

As illustrated in FIG. 3B, packaging enclosure 334 encapsulates semiconductor die 310, die attach material 312, integrated output inductor 358, wire bonds 328, I/O pads 330, and electrical connectors 372 to form an enclosed package. Packaging enclosure 334 may include any suitable substance, such as an encapsulant and/or a molding compound for providing mechanical and/or environmental protection for semiconductor package 302.

Referring now to FIG. 3C, FIG. 3C illustrates a cross-sectional view of a semiconductor package having an integrated output inductor, according to one implementation of the present disclosure. In particular, FIG. 3C illustrates a cross-section of semiconductor package 302 along line 390-390 in FIG. 3A. With similar numerals representing similar features in FIG. 3A, semiconductor package 302 in FIG. 3C includes semiconductor die 310 stacked over and attached to integrated output inductor 358 by die attach material 312. Integrated output inductor 358 includes, in part, core 322 and a winding having top conductive clip 324*d* connected to bottom conductive clip 326*d*. As illustrated in FIG. 3C, semiconductor package 302 also includes I/O pads 330 on the perimeters of integrated output inductor 358. Packaging enclosure 334 is configured to encapsulate semiconductor die 310, die attach material 312, integrated output inductor 358, I/O pads 330, and electrical connectors 372 to form an enclosed package.

As illustrated in FIG. 3C, top conductive clip 324*d*, similar to top conductive clip 324*c* in FIG. 3B, includes non-etched portions 327*a* and 327*c*, and partially etched portion 327*b*. Non-etched portions 327*a* and 327*c* retain a full thickness of top conductive clip 324*d*, while partially etched portion 327*b* has a thickness that is a fraction (e.g., half) of the full thickness of top conductive clip 324*d*. In the present implementation, non-etched portions 327*a* and 327*c* have a substantially uniform thickness that is the full thickness of top conductive clip 324*d*. Partially etched portion 327*b* also has a substantially uniform thickness that is a fraction of the full thickness of top conductive clip 324*d*. Bottom conductive clip 326*d* includes non-etched portions 325*a* and 325*c*, and partially etched portion 325*b*. Non-etched portions 325*a* and 325*c* retain a full thickness of bottom conductive clip 326*d*, while partially etched portion 325*b* has a thickness that is a fraction (e.g., half) of the full thickness of bottom conductive clip 326*d*. In the present implementation, non-etched portions 325*a* and 325*c* have a substantially uniform thickness that is the full thickness of bottom conductive clip 326*d*. Partially etched portion 325*b* also has a substantially uniform thickness that is a fraction of the full thickness of bottom conductive clip 326*d*.

As illustrated in FIG. 3C, top conductive clip 324*d* and bottom conductive clip 326*d* form a winding around core 322, where non-etched portion 327*c* of top conductive clip 324*d* is electrically and mechanically coupled to non-etched portion 325*c* of bottom conductive clip 326*d* at one end of integrated output inductor 358 by using electrical connector 372, such as solder paste. Partially etched portion 327*b* of top conductive clip 324*d* forms a recess in top conductive clip 324*d*. Partially etched portion 325*b* of bottom conductive clip 326*d* forms a recess in bottom conductive clip 326*d* under the recess formed by partially etched portion 327*b* of top conductive clip 324*d*. Thus, the recesses in top conductive clip 324*d* and bottom conductive clip 326*d* together form an interior space for housing or embedding core 322.

It is noted that, in the cross-sectional view in FIG. 3C, top conductive clip 324d and bottom conductive clip 326d are only connected at one end of integrated output inductor 358. This is because top conductive clip 324d is situated above and arranged at a slightly slanted angle from bottom conductive clip 326d (as shown in FIG. 3A). As a result of this arrangement, non-etched portion 325a of bottom conductive clip 326d is connected to a non-etched portion (e.g., non-etched portion 323a in FIG. 3B) of top conductive clip 324c (not explicitly shown in FIG. 3B), while non-etched portion 327a of top conductive clip 324d is connected to a non-etched portion of bottom conductive clip 326e (not explicitly shown in FIG. 3B). Thus, top conductive clips 324 and bottom conductive clips 326 are connected in such a way to form a continuous wire winding around core 322 as shown in FIG. 3A.

As illustrated in FIG. 3C, I/O pads 330 each include top pad 331 connected to bottom pad 332 by using electrical connector 372, such as solder paste. In the present implementation, top pad 331 and bottom pad 332 may each include a non-etched portion and a partially etched portion, as shown in FIG. 3C. In the present implementation, bottom conductive clip 326d and bottom pads 332 of I/O pads 330 may be formed in a single processing action, while top conductive clip 324d and top pads 331 of I/O pads 330 may be formed in a single processing action. In the present implementation, top conductive clip 324d, bottom conductive clip 326d and I/O pads 330 may each include any conductive material having high current carrying capability and a suitably low electrical resistance, such as copper, aluminum, tungsten or a metallic alloy.

As illustrated in FIG. 3C, packaging enclosure 334 encapsulates semiconductor die 310, die attach material 312, integrated output inductor 358, I/O pads 330, and electrical connectors 372 to form an enclosed package. Packaging enclosure 334 may include any suitable substance, such as an encapsulant and/or a molding compound for providing mechanical and/or environmental protection for semiconductor package 302.

As illustrated in FIGS. 3A, 3B and 3C, because core 322 of integrated output inductor 358 is embedded in the interior space formed by partially etched portions of top conductive clips 324 and bottom conductive clips 326, the overall height of integrated output inductor 358 can be significantly reduced, which in turn reduces the form factor of semiconductor package 302. In contrast to conventional power semiconductor packages having individual semiconductor dies arranged side by side with output inductors, because semiconductor die 310 is situated over integrated output inductor 358, in accordance with the present implementation, semiconductor package 302 can advantageously have a reduced footprint, thereby further reducing the form factor of semiconductor package 302.

Also, by employing top conductive clips 324 and bottom conductive clips 326 to form a continuous wire winding around core 322, with a space between each adjacent pair of top conductive clips 324 and bottom conductive clips 326, packaging enclosure 334 can occupy the interior space between top conductive clips 324 and bottom conductive clips 326 and around core 322 to provide mechanical support and hold core 322 in place. Also, packaging enclosure 334 can encapsulate semiconductor die 310 and integrated output inductor 358 in a single encapsulation action, thereby reducing manufacturing time and cost. Packaging enclosure 334 can have excellent thermal conductivity to transfer heat away from semiconductor die 310 and integrated output inductor 358. In addition, as bottom conductive clips 326 are exposed at a bottom surface of semiconductor package 302, bottom conductive clips 326 can function as a heatsink to provide enhanced thermal dissipation by radiating heat directly to ambient air, for example. Moreover, as bottom conductive clips 326 are exposed at the bottom surface of semiconductor package 302, semiconductor package 302 can be surface mounted to a substrate, such as a printed circuit board.

From the above description it is manifest that various techniques can be used for implementing the concepts described in the present application without departing from the scope of those concepts. Moreover, while the concepts have been described with specific reference to certain implementations, a person of ordinary skill in the art would recognize that changes can be made in form and detail without departing from the scope of those concepts. As such, the described implementations are to be considered in all respects as illustrative and not restrictive. It should also be understood that the present application is not limited to the particular implementations described above, but many rearrangements, modifications, and substitutions are possible without departing from the scope of the present disclosure.

The invention claimed is:

1. A semiconductor package comprising:
   a semiconductor die comprising a control transistor and a sync transistor;
   an integrated output inductor comprising a winding around a core, and coupled to said semiconductor die;
   wherein said winding comprises a plurality of top conductive clips connected to a plurality of bottom conductive clips.

2. The semiconductor package of claim 1 wherein said control transistor and said sync transistor are configured as a half-bridge.

3. The semiconductor package of claim 2 wherein said integrated output inductor is coupled to a switched node of said half-bridge.

4. The semiconductor package of claim 1 wherein at least one of said plurality of top conductive clips and said plurality of bottom conductive clips includes a partially etched portion and a non-etched portion.

5. The semiconductor package of claim 1 wherein said semiconductor die further comprises a driver integrated circuit coupled to said control transistor and said sync transistor.

6. The semiconductor package of claim 1 wherein at least one of said control transistor and said sync transistor comprises a group III-V transistor.

7. The semiconductor package of claim 1 wherein at least one of said control transistor and said sync transistor comprises a group IV transistor.

8. The semiconductor package of claim 1 wherein said core is a ferrite core.

9. The semiconductor package of claim 1 wherein said semiconductor die is attached to said integrated output inductor by a die attach material.

10. The semiconductor package of claim 1 wherein said semiconductor die and said integrated output inductor are encapsulated in a molding compound.

11. A semiconductor package comprising:
   an integrated output inductor comprising a winding around a core;
   a power stage stacked over said integrated output inductor, said power stage comprising a control transistor and a sync transistor connected in a half-bridge;

wherein said winding comprises a plurality of top conductive clips connected to a plurality of bottom conductive clips.

12. The semiconductor package of claim 11 wherein at least one of said plurality of top conductive clips and said plurality of bottom conductive clips includes a partially etched portion and a non-etched portion.

13. The semiconductor package of claim 11 wherein said integrated output inductor is coupled to a switched node of said half-bridge.

14. The semiconductor package of claim 11 wherein said power stage further comprises a driver integrated circuit coupled to said control transistor and said sync transistor.

15. The semiconductor package of claim 11 wherein said core is a ferrite core.

16. The semiconductor package of claim 11 wherein at least one of said control transistor and said sync transistor comprises a group III-V transistor.

17. The semiconductor package of claim 11 wherein at least one of said control transistor and said sync transistor comprises a group IV transistor.

18. The semiconductor package of claim 11 wherein said control transistor and said sync transistor are monolithically integrated on a semiconductor die.

19. The semiconductor package of claim 18 wherein said semiconductor die is attached to said integrated output inductor by a die attach material.

20. The semiconductor package of claim 11 wherein said power stage and said integrated output inductor are encapsulated in a molding compound.

* * * * *